United States Patent [19]
Achutharaman et al.

[11] Patent Number: 6,019,839
[45] Date of Patent: Feb. 1, 2000

[54] METHOD AND APPARATUS FOR FORMING AN EPITAXIAL TITANIUM SILICIDE FILM BY LOW PRESSURE CHEMICAL VAPOR DEPOSITION

[75] Inventors: Vedapuram S. Achutharaman, Santa Clara; Johanes Swenberg, Los Gatos, both of Calif.

[73] Assignee: Applied Materials, Inc., Santa Clara, Calif.

[21] Appl. No.: 09/062,292

[22] Filed: Apr. 17, 1998

[51] Int. Cl.$^7$ .................................................. C03B 23/00
[52] U.S. Cl. .............................................. 117/88; 117/104
[58] Field of Search ........................................ 117/88, 104

[56] References Cited

U.S. PATENT DOCUMENTS

| | | | |
|---|---|---|---|
| 4,554,045 | 11/1985 | Bean et al. ............................. | 117/105 |
| 4,619,038 | 10/1986 | Pintchovski ............................. | 438/586 |
| 4,650,698 | 3/1987 | Moriya et al. .......................... | 427/327 |
| 4,668,530 | 5/1987 | Reif et al. ............................... | 438/655 |
| 5,104,694 | 4/1992 | Saito et al. .............................. | 427/255 |
| 5,164,040 | 11/1992 | Eres et al. ............................... | 427/600 |
| 5,421,957 | 6/1995 | Carlson et al. .......................... | 216/58 |
| 5,876,976 | 3/1999 | Regolini et al. ..................... | 427/255.4 |
| 5,880,505 | 3/1999 | Fujii et al. ............................... | 257/383 |

OTHER PUBLICATIONS

Hugh O. Pierson, "Handbook of Chemical Vapor Deposition (CVD), Principles, Technology and Applications", Library of Congress Catalog Card No.: 91–46658, 1992, pp. 246–247.

Kunio Saito, Yoshinobu Arita, "Cause of Aligned–Orientation Growth of Titanium Silicide in Plasma Enhanced Chemical Vapor Deposition", J. Electrochem. Soc., vol. 143, No. 11, Nov. 1996, pp. 3778–3784.

D. Maury, M. L. Rostoll, P. Gayet, Chemical Vapor Deposition of TiSi$_2$ Using an Industrial Integrated Cluster Tool, J. Vac. Sci. Technol. B. 15(1), Jan./Feb. 1997, pp. 133–137.

*Primary Examiner*—Benjamin Utech
*Assistant Examiner*—Donald J. Champagne
*Attorney, Agent, or Firm*—Blakely Sokoloff Taylor & Zafman

[57] ABSTRACT

A method and apparatus for forming an epitaxial titanium silicide film is described. According to the present invention, a monocrystalline silicon substrate is placed in a deposition chamber and heated to a temperature between 710–770° C. A silicon source gas and titanium tetrachloride are then provided into the deposition chamber. The deposition pressure is maintained between 5–10 torr. An epitaxial titanium silicide film is then formed on the substrate from the silicon source gas and the titanium tetrachloride.

13 Claims, 5 Drawing Sheets

METHOD AND APPARATUS FOR FORMING AN EPITAXIAL TITANIUM SILICIDE FILM BY LOW PRESSURE CHEMICAL VAPOR DEPOSITION

BACKGROUND OF THE INVENTION

1) Field of the Invention

The present invention is related to the field of semiconductor manufacturing and more specifically to a method and apparatus for forming an epitaxial titanium silicide film by low pressure chemical vapor deposition.

2) Discussion of Related Art

Semiconductor devices are made up of literally millions of discreet devices which are interconnected together to form functional circuits, such as microprocessors, memories and programmable logic devices. In order to improve circuit performance, the fabrication processes generally utilize low resistance metal films such as silicides to form low resistance contacts to devices. Titanium silicide deposited by low pressure chemical vapor deposition has been proposed to reduce the contact resistance of devices.

FIG. 1 is an illustration of a current CVD apparatus which can be used to deposit a titanium silicide film on a semiconductor wafer or substrate. A susceptor 120 divides a chamber 112 into one portion which is below the susceptor 124 and a second portion which is above the susceptor 122. The susceptor 120 is generally mounted on a shaft 126 which rotates the susceptor about its center to achieve a more uniform processing of the wafer. A flow of processing gas such as deposition gas 115 is provided into the upper portion 122 of the chamber. The chamber generally has a gas inlet 178 at one side thereof and a gas exhaust passage 116 at the opposite side to achieve a flow of processing gas across the wafer. The susceptor 120 is heated in order to heat the wafer to a desired deposition temperature. One method to heat the susceptor is by the use of lamps 134 provided around the chamber and directing the light into the chamber and onto the susceptor 120.

In a method of depositing titanium silicide on a wafer by thermal chemical vapor deposition, a deposition gas 115 containing titanium chloride (TiCl4) and a silicon source gas, such as SiH4, is fed into the reaction chamber 112. As deposition gas is fed into the chamber, it is heated by preheat ring 128 and susceptor 120 and wafer and reacts to form titanium silicide. Such a process can be used to form high quality polycrystalline titanium silicide films. In certain applications, however, a polycrystalline titanium silicide film may not be optimal and an epitaxial (monocrystalline) titanium silicide film is desired. Unfortunately, however, there is presently no technique to form an epitaxial (monocrystalline) titanium silicide film by thermal chemical vapor deposition. Presently, only plasma enhanced chemical vapor deposition (PECVD) has been used to deposit epitaxial titanium silicide.

Thus what is desired is a method and apparatus for forming an epitaxial titanium silicide film by thermal low pressure chemical vapor deposition.

SUMMARY OF THE INVENTION

A method and apparatus for forming an epitaxial titanium silicide film is described. According to the present invention, a monocrystalline silicon substrate is placed in a deposition chamber and heated to a temperature between 710–770° C. A silicon source gas and titanium tetrachloride are then provided into the deposition chamber. The deposition pressure is maintained between 5–10 torr. An epitaxial titanium silicide film is then formed on the substrate from the silicon source gas and the titanium tetrachloride.

BRIEF DESCRIPTION OF THE DRAWINGS

FIG. 4b is an illustration of the cross-sectional view showing the formation of an epitaxial silicon layer on the substrate of FIG. 4a;

DETAILED DESCRIPTION OF THE PRESENT INVENTION

The present invention is a method and apparatus for uniformly forming an epitaxial titanium silicide film on a substrate. In the following description numerous specific details such as specific equipment configuration and process steps have been described in order to provide a thorough understanding of the present invention. It is to be appreciated that the present invention can be practiced without these specific details. In other instances well known semiconductor equipment and manufacturing processes have not been given in detail in order to not necessarily obscure the present invention.

The present invention describes the method and apparatus for selectably depositing a uniform epitaxial titanium silicide film on a silicon substrate. According to the present invention, a wafer is placed in a deposition chamber of a chemical vapor deposition apparatus and heated to a temperature between 710–770° C. A process gas mix including a silicon source gas such as, but not limited to silane and dichlorosilane, is then fed into the deposition chamber as is titanium tetrachloride (TiCl4). The chamber pressure is maintained between 5–10 torr while providing the process gas into the chamber. The deposition gas is then thermally disassociated to form titanium atoms and silicon atoms which combine to form an epitaxial titanium silicide film on the silicon areas of the substrate. The process conditions are controlled so that the epitaxial film is deposited at a rate of less than 400 Å per minute. Utilizing the above-described process conditions enables a uniform epitaxial titanium silicide film to be selectably formed on the epitaxial silicon substrate. The epitaxial or oriented layer achieves good film morphology and a smooth silicon/titanium silicide interface which is critical for shallow junction applications. The epitaxial titanium silicide film can be used as a template or nucleation layer for further deposition of titanium silicide using deposition conditions which are different than the epitaxial layer process.

Figure 1:
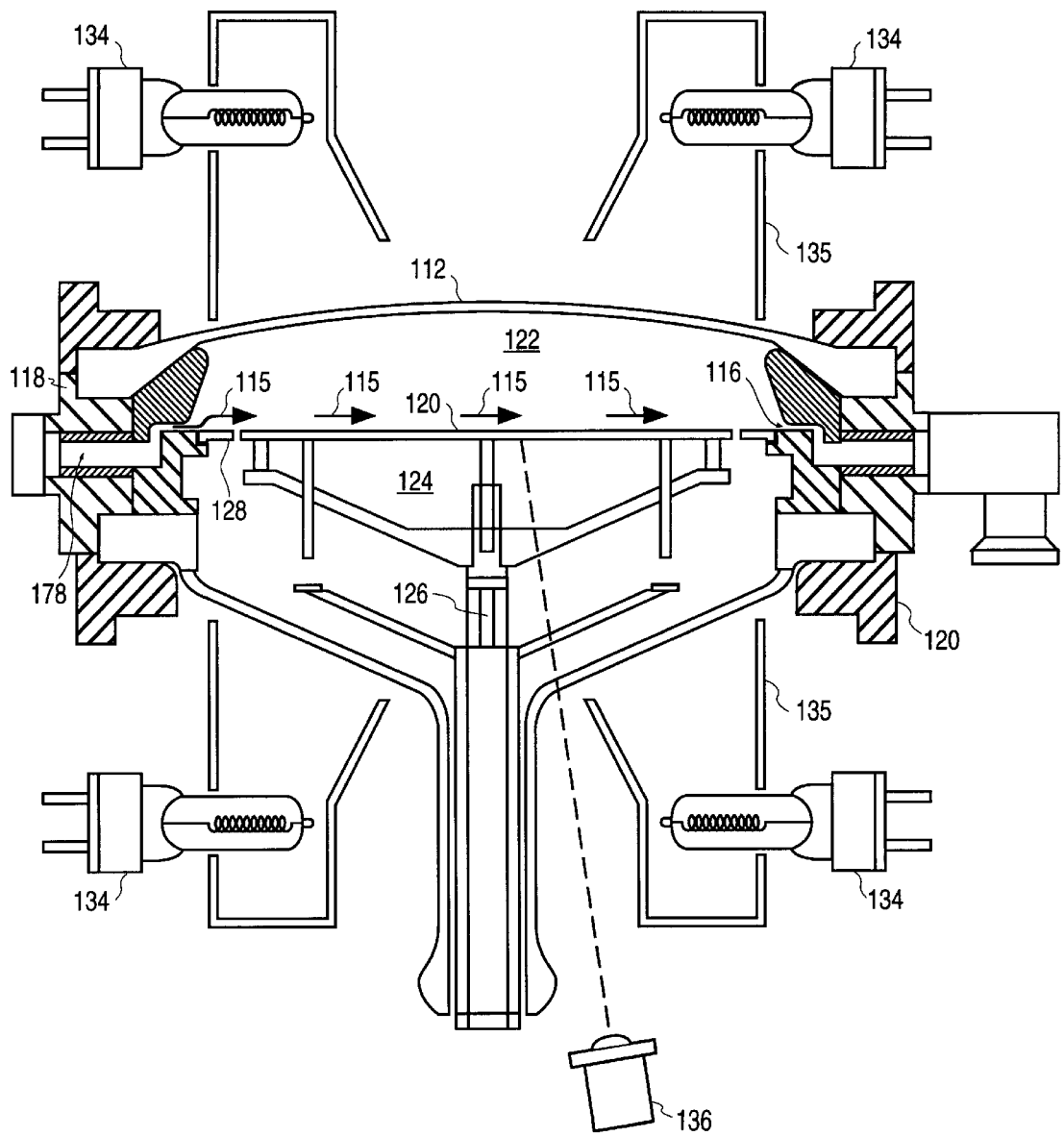
FIG. 1 is an illustration of a cross-sectional view of a deposition chamber.
Figure 2:
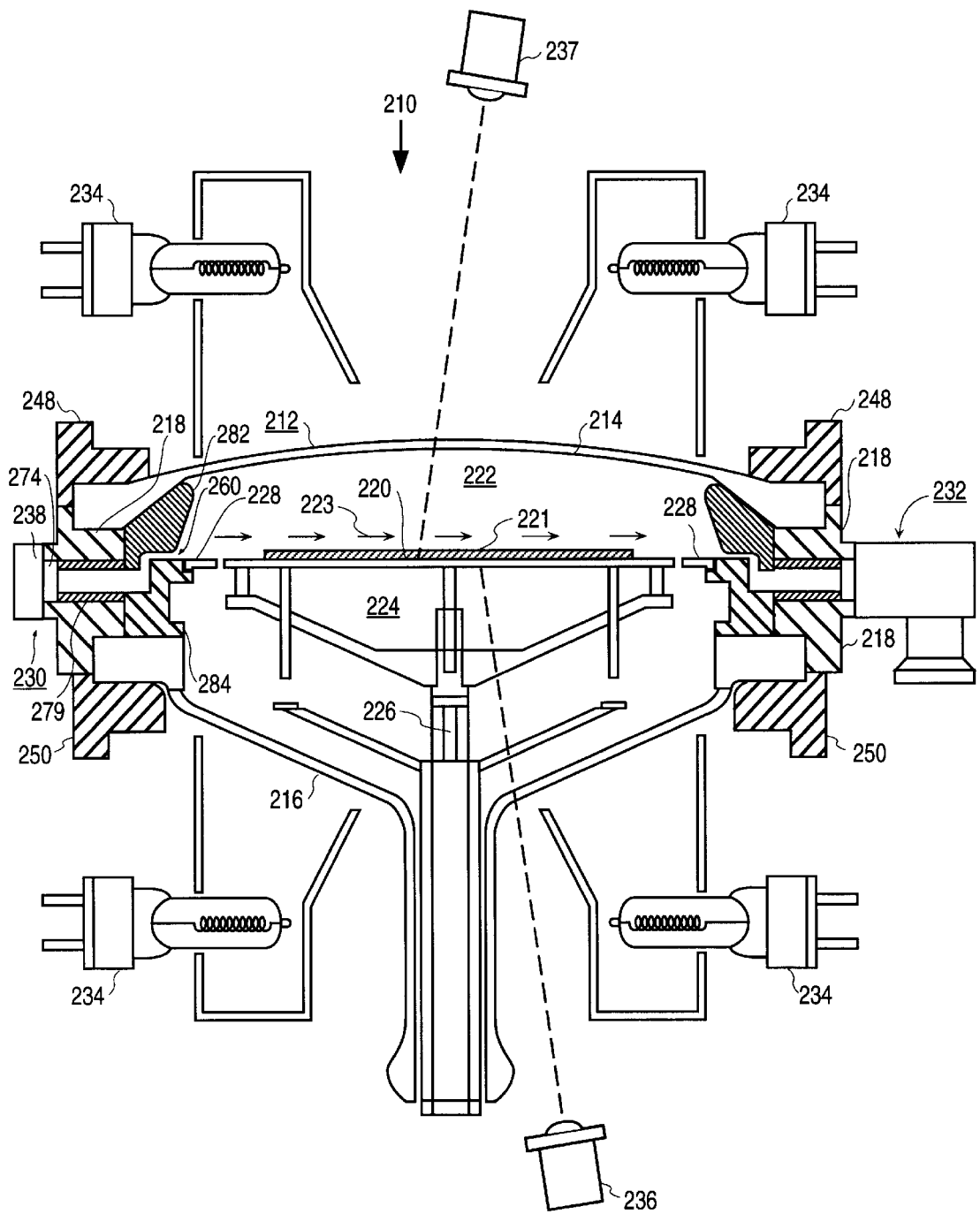
FIG. 2 is an illustration of a chemical vapor deposition (CVD) chamber which can be utilized to deposit the epitaxial titanium silicide film of the present invention.

A chemical vapor deposition apparatus 210 which can be used in accordance with the present invention is shown on FIG. 2. The deposition apparatus 210 comprises a deposition chamber 212 having an upper dome 214, a lower dome 216 and a side wall 218 between the upper and lower domes 214 and 216. An upper liner 282 and a lower liner 284 are mounted against the inside surface of sidewall 218. The upper and lower domes 214 and 216 are made of a transparent material to allow heating light to pass there through into the chamber 212.

Within the chamber 212 is a flat, circular susceptor 220 for supporting a wafer or substrate 221. The wafer or substrate 221 is placed face up on the top side of susceptor 220. The susceptor 220 extends transversely across the chamber 212 at the side wall 218 to divide the chamber 212 into an upper portion 222 above the susceptor 220 and a lower portion 224 below the susceptor 220. The susceptor 220 is mounted on a shaft 226 which extends perpendicularly downwardly from the center of the bottom of the susceptor 220. The shaft 226 is connected to a motor (not shown) which rotates shaft 226 and thereby rotates the susceptor 220. An annular preheat ring 228 is connected at its outer periphery to the inside periphery of lower liner 284 and extends around the susceptor 220. The preheat ring 228 is in the same plane as the susceptor 220 with the inner edge of the preheat ring 228 separated by a gap 229 from the outer edge of the susceptor 220.

An inlet manifold 230 is positioned in the side of chamber 212 and is adapted to admit gas into the chamber 212. An outlet port 232 is positioned in the side of chamber 212 diagonally opposite the inlet manifold and is adapted to exhaust gases from the deposition chamber 212. The flow of deposition gas 223 from inlet manifold 230 to outlet port 232 is substantially laminar over wafer 221. Deposition chamber 212 has a volume of approximately 12 liters. It is to be appreciated the deposition gas flow provided herein are with respect to a 12 liter chamber volume, and one skilled in the art will appreciate the ability to scale the flow rates for different volume chambers.

A plurality of high intensity lamps 234 are mounted around the chamber 212 and direct their light through the upper and lower domes 214 and 216 onto the susceptor 220 to heat the susceptor 220. The upper and lower domes 214 and 216 are made of a material which is transparent to the light from the lamps 234, such as clear quartz. The upper and lower domes 214 and 216 are generally made of quartz because quartz is transparent to light of both visible and IR frequencies; it exhibits a relatively high structural strength; and it is chemically stable in the process environment of the deposition chamber 212. Although IR frequency lamps are the preferred means for heating wafers and in deposition chamber 220, other methods may be used such as resistance heaters and RF inductive heaters. Preheat ring 228 and susceptor 220 are made of a material, such as silicon carbide or silicon carbide coated graphite, which is opaque to the radiation frequency of the lamps so that they can be heated by lamps 234. Preheat ring 228 and susceptor 220 are made of a material which is substantially unreactive with deposition gas used to deposit a film according to the present invention.

An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper domes 214. A lower clamping ring 250 extends around the periphery of the outer surface of the lower dome 216. The upper and lower clamping rings are secured together so as to clamp the upper and lower domes 214 and 216 to the side wall 218.

Reactor 210 includes a deposition gas inlet manifold 230 for feeding deposition gas into chamber 212 deposition. Gas inlet manifold 230 includes a baffle 274, an insert plate 279 positioned within sidewall 218, and a passage 260 formed between upper liner 282 and lower liner 284. Passage 260 is connected to the upper portion 222 of chamber 212. Deposition gas are fed from gas cap 238 through baffle 274, insert plate 279 and passage 260 and into the upper portion 222 of chamber 212.

Figure 3:
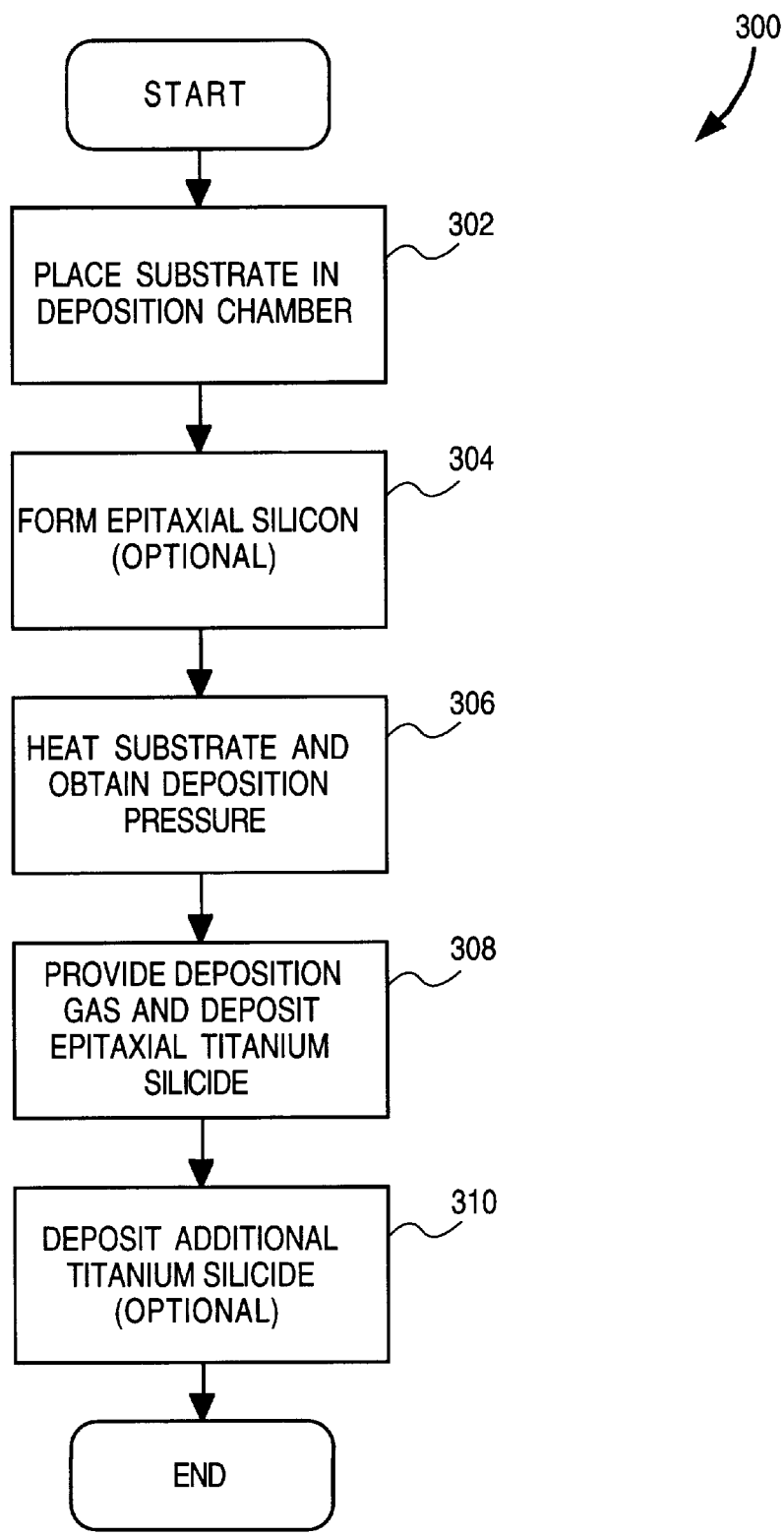
FIG. 3 is a flowchart which illustrates a selective epitaxial titanium silicide deposition process in accordance with the present invention.

A method of selectively depositing an epitaxial titanium silicide film in accordance with the present invention is illustrated in the flowchart 300 shown in FIG. 3 and is illustrated with respect to the substrate cross sections of FIGS. 4a–4d. It is to be appreciated the present invention is not intended to be limited to the disclosed specific embodiment which is to be taken as illustrative of the present invention rather than limiting.

The first step as set forth in step 302 of flowchart 300 is to place a substrate into a deposition chamber of a low pressure chemical vapor deposition apparatus such as deposition chamber 212 of apparatus 210 shown in FIG. 2.

In an embodiment of the present invention the substrate is a silicon substrate or wafer 400 having a plurality of active devices such as metal oxide semiconductor (MOS) transistors 402 formed therein. The silicon wafer includes an epitaxial (monocrystalline) silicon substrate doped to a desired conductivity type and density. A pair of source/drain regions 406 are formed in the epitaxial silicon substrate 404 on opposite sides of a gate electrode 408 which is typically polysilicon. A pair of insulating sidewall spacers, typically silicon dioxide or silicon nitride, are formed along opposite sides of gate electrode 408. A capping insulating layer 412 such as silicon dioxide or silicon nitride can be formed on top of gate electrode 412. Individual MOS transistors 402 on wafer 400 are electrically isolated from one another by field isolation regions such as but not limited to locally grown silicon dioxide (LOCOS) isolation regions.

In order to reduce the contact resistance to MOS transistor 402, an embodiment of the present invention selectively deposits a high quality epitaxial titanium silicide film on the source/drain regions 406 formed in epitaxial silicon substrate 404. The titanium silicide deposition process of the present invention is selective so that it will deposit epitaxial titanium silicide only on exposed silicon areas, such as source/drain region 406 and on polycrystalline/textured titanium silicide and on polysilicon, amorphous silicon and silicide, and not on insulating materials such as spacers 410, capping dielectric 412 and isolation regions 414. It is to be appreciated that epitaxial titanium silicide process of the present invention is only being illustrated with respect to the formation of titanium silicide on source/drain contact regions but is equally applicable and useful for the formation of titanium silicide on other areas such as, but not limited to, diffusion regions of a bipolar transistor, and buried contacts.

Figure 4A:
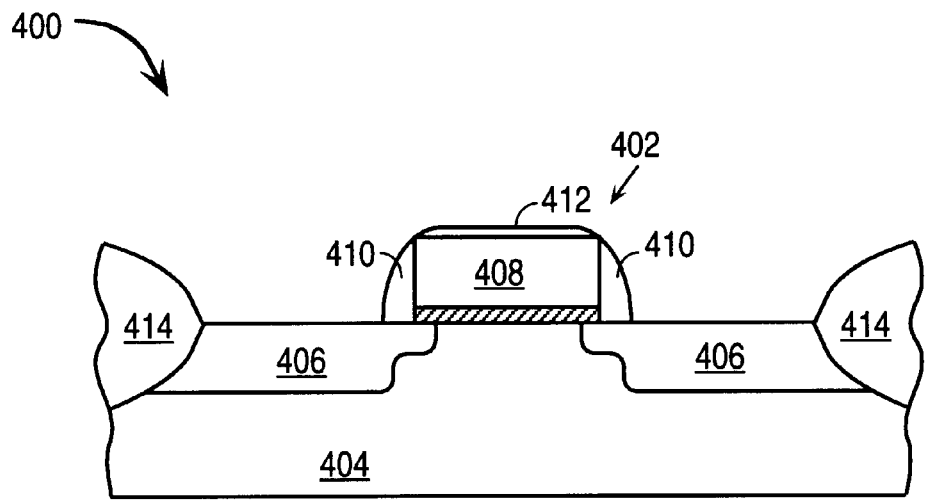
FIG. 4a is an illustration of the cross-sectional view of a substrate on which the selective epitaxial titanium silicide process of the present invention can be formed.
Figure 4B:
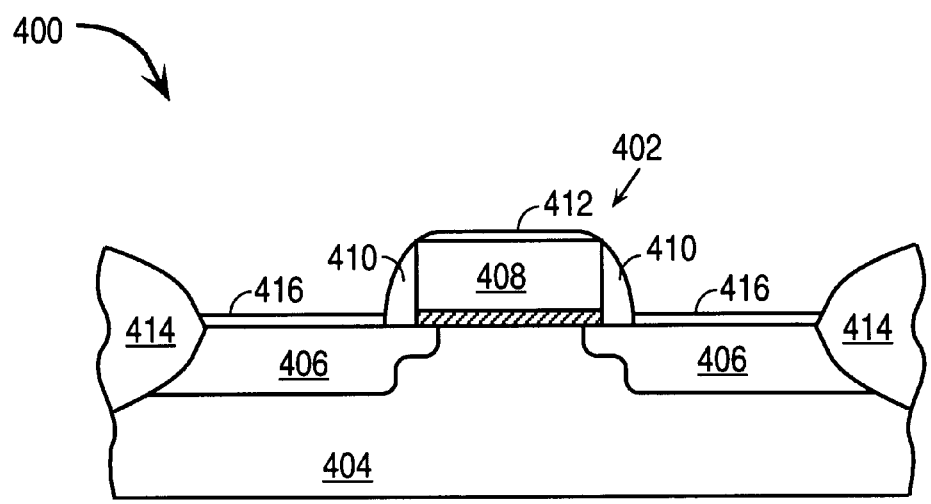

Next, if desired, as set forth in block 304, a silicon epitaxial film 416 can be selectively deposited onto source/drain regions 406 as shown in FIG. 4b. It is to be appreciated that the lattice of epitaxial substrate 404 can be damaged during the placement of dopants (such as by ion implantation) into epitaxial substrate 404 when forming source/drain regions 406. Depositing an epitaxial silicon film 416 onto source/drain regions 406 homogenizes the surface of source/drain regions 406 and provides a clean pristine surface from which to grow the epitaxial titanium silicide film of the present invention. A suitable selective epitaxial silicon film can be formed to a thickness of between 100–200 Å and can be formed by chemical vapor deposition utilizing a process gas mix comprising a silicon source gas, such as dichlorosiline ($Si_2H_2Cl_2$), HCl, and hydrogen while the substrate is heated to a temperature of between 800–850° C. and a deposition pressure of between 5–20 torr.

It is to be appreciated that if the lattice of epitaxial silicon substrate 404 is sufficiently intact, one need not necessarily form epitaxial silicon film 416 prior to the formation of the epitaxial titanium silicide layer of the present invention. Additionally, it is to be appreciated that well known cleaning steps such as HF dips and in-situ hydrogen ($H_2$) bakes can be used to remove native oxides formed on substrate 404 prior to the formation of silicon epitaxial layer 416 (if used) or the formation of the epitaxial titanium silicide if no epitaxial silicon is formed.

Next, as set forth in block 306 of flowchart 300, substrate 400 is heated to a deposition temperature and chamber 212 is pumped down to a desired deposition pressure. In order to form an epitaxial titanium silicide film by chemical vapor deposition in accordance with the present invention, substrate 400 is heated to a temperature between 710–770° C., and the chamber pressure is reduced to between 5–10 torr.

Figure 4C:
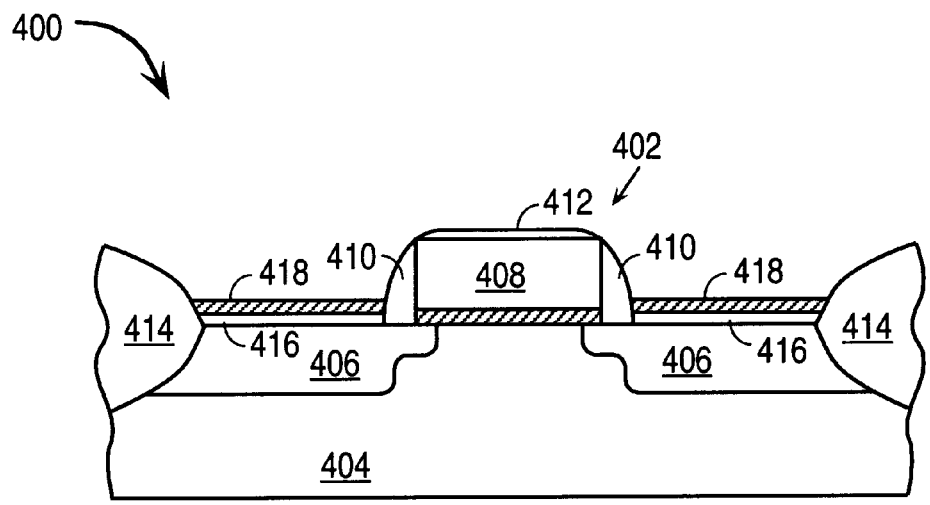
FIG. 4c is an illustration of the cross-sectional view showing the formation of an epitaxial titanium silicide film in accordance with the present invention on the substrate of FIG. 4b.

Next, as set forth in block 308, and shown in FIG. 4c, deposition gas is fed into chamber 212 to selectively deposit an epitaxial titanium silicide film on substrate 400. An epitaxial titanium silicide film can be formed by providing a deposition gas comprising titanium tetrachloride ($TiCl_4$) and a silicon source gas selected from the group consisting of silane ($SiH_4$), disilane ($Si_2H_6$), and dichlorosilane ($SiCl_2H_2$). To form an epitaxial titanium silicide film, titanium tetrachloride ($TiCl_4$) is fed through an argon bubbler at, for example 18° C., and into chamber 212 at a rate between 2–10 sccms while the silicon source gas is fed into chamber 212 at a rate of between 5–25 sccms. Additionally, a carrier gas such as hydrogen ($H_2$) is included in the deposition gas and is fed into deposition chamber 212 at a rate of about 10 slm. The deposition pressure of chamber 212 is maintained between 5–10 torr and the substrate temperature is maintained between 710–770° C. while providing the deposition gas into chamber 212 and forming the epitaxial titanium silicide film of the present invention.

The flow rates of the silicon source gas, and titanium tetrachloride ($TiCl_4$) into the chamber are controlled and adjusted as are the chamber pressure and substrate temperature within the range as set forth to produce a low deposition rate of less than 400 Å per minute. The low deposition rate and process ranges enable the formation of a very smooth epitaxial titanium silicide film 418 on epitaxial silicon layer 416 or epitaxial silicon substrate 404.

In one embodiment of the present invention the silicon source gas is silane ($SiH_4$) and is provided into deposition chamber 212 at a flow rate of approximately 14 sccms while titanium tetrachloride ($TiCl_4$) is provided into deposition chamber 212 at a rate of between 4–5 sccms. In another embodiment of the present invention the silicon source gas is dichlorosilane ($Si_2H_2Cl_2$) and the dichlorosilane is provided into deposition chamber 212 at a flow rate of approximately 18 sccms while titanium tetrachloride is provided into deposition chamber 212 at a rate of approximately 4–5 sccms. In each case the deposition temperature is maintained between 710–770° C. and the deposition pressure maintained between 5–10 torr while deposition gas is fed into deposition chamber 212. Additionally, in each case process conditions are controlled to provide a deposition rate of less than 400 Å per minute.

It is to be appreciated that the epitaxial titanium silicide formation process of the present invention is entirely a thermal chemical vapor deposition process which utilizes only thermal energy and does not utilize any additional energy sources such as plasma enhancement to achieve gas disassociation and deposition. That is, in the epitaxial titanium silicide deposition process of the present invention, only heat from heated substrate 400, susceptor 220, and preheat ring 228 is used to disassociate the silicon source gas to provide silicon atoms and to disassociate the titanium tetrachloride to provide titanium atoms. The silicon atoms and the titanium atoms then combine to form epitaxial titanium silicide on substrate 400.

The process conditions of the present invention set forth above form a C49 phase epitaxial titanium silicide film 418. Although C49 phase titanium silicide has a slightly higher resistivity (resistivity of approximately 60–100 $\mu$ohm-cm), then C54 phase titanium silicide (resistivity of approximately 15–20 $\mu$ohm-cm), C49 phase titanium silicide more closely matches the lattice structure of the epitaxial silicon which enables the formation of an epitaxial titanium silicide layer thereon. The epitaxial titanium silicide film of the present invention provides an excellent morphology and provides a smooth silicon/titanium silicide interface which is critical for shallow junction applications. Once the film 418 reaches a critical thickness of approximately 400 Å, the C49 phase titanium silicide film transforms to the desired low resistivity C59 phase titanium silicide.

Figure 4D:
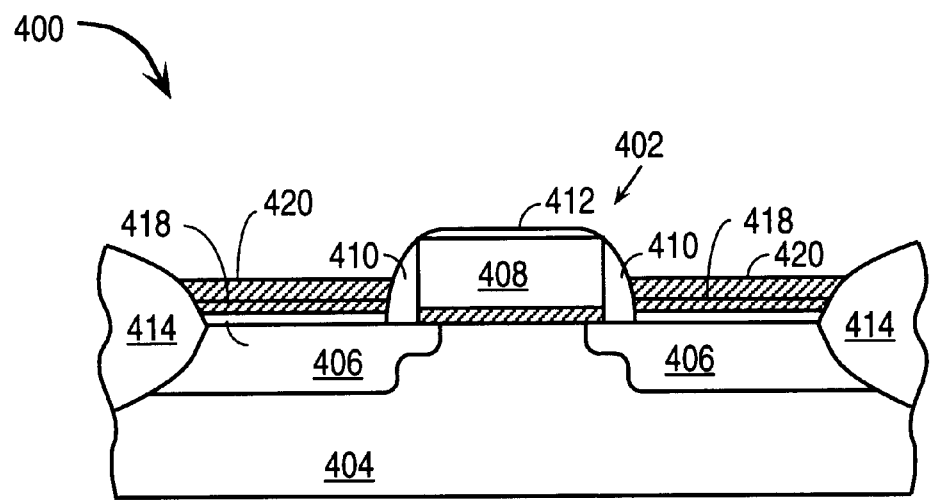
FIG. 4d is an illustration of the cross-sectional view showing the formation of an additional titanium silicide film on the epitaxial titanium silicide film of the present invention on the substrate of FIG. 4c.

Next, as set forth in block 310 of flow chart 300 and shown in FIG. 4d, after sufficiently thick epitaxial titanium silicide film 418 has been formed, deposition conditions can be changed to deposit titanium silicide 420 at a growth rate greater than 400 Å in order to improve wafer throughput. Using the epitaxial titanium silicide film of the present invention as a template or nucleation layer enables the formation of a dual layer or multiple layer titanium silicide film with a very smooth surface. A C54 titanium silicide film can be formed from a deposition gas comprising titanium tetrachloride and a silicon source gas. For example titanium tetrachloride can be fed through an argon bubbler at for example 18° C. into the chamber 212 at a rate of between 1–5 sccms while a silicon source gas is fed into the chamber 212 at a rate between 5–50 sccms while maintaining a chamber pressure of between 5–80 torr and a wafer temperature of between 700–850° C.

Thus, a method and apparatus for selectively depositing an epitaxial titanium silicide film by low pressure chemical vapor deposition has been described.

What is claimed is:

1. A method of forming an epitaxial titanium silicide film comprising:

heating a substrate having an epitaxial silicon surface in a deposition chamber to a temperature between 710–770° C.;

providing a silicon source gas into said deposition chamber;

providing titanium tetrachloride ($TiCl_4$) into said deposition chamber;

maintaining a deposition pressure of between 5–10 torr in said deposition chamber; and forming an epitaxial titanium silicide film directly on said epitaxial silicon surface from said silicon source gas and said titanium tetrachloride.

2. The method of claim 1 wherein the flow of said silicon source gas into said deposition chamber, the flow of said titanium tetrachloride into said deposition chamber, said temperature of said substrate, and said deposition pressure in said chamber are controlled to produce a titanium silicide at a growth rate of less than 400 Å per minute.

3. The method of claim 1 wherein said silicon source gas is selected from the group consisting of silane (SiH4), dichlorosilane (SiH2Cl2), and disilane (Si2H6).

4. The method of claim 1 further comprising the step of providing hydrogen gas (H2) into said deposition chamber.

5. The method of claim 1 wherein said titanium tetrachloride (TiCl4) is provided into said deposition chamber at a flow rate of between 2–10 sccm.

6. The method of claim 5 wherein said titanium tetrachloride (TiCl4) is provided into said deposition chamber at a rate of between 4–5 sccm.

7. The method of claim 3 wherein said silicon source gas is provided into said deposition chamber at a rate of between 5–25 sccm.

8. The method of claim 7 wherein said silicon source gas is silane and is provided into said deposition chamber at a flow rate of approximately 14 sccm.

9. The method of claim 7 wherein said silicon source gas is dichlorosilane and said dichlorosilane is provided into said deposition chamber at a flow rate of approximately 18 sccm.

10. The method of claim 1 further comprising the step of prior to forming said epitaxial titanium silicide film forming an epitaxial silicon film directly on said epitaxial silicon surface of said substrate, and then forming said epitaxial titanium silicide film directly on said epitaxial silicon film.

11. A method of forming an epitaxial titanium silicide film comprising:

heating a substrate having an epitaxial silicon surface in a deposition chamber to a temperature between 710–770° C.;

providing titanium tetrachloride into said deposition chamber;

providing a silicon source gas selected from the group consisting of silane ($SiH_4$), dichlorosilane ($SiH_2Cl_2$), and disilane ($Si_2H_6$) into said deposition chamber;

maintaining a deposition pressure of between 5–10 torr in said deposition chamber;

thermally decomposing said titanium tetrachloride to provide titanium atoms, and thermally decomposing said silicon source gas to provide silicon atoms; and forming an epitaxial titanium silicide film directly on said epitaxial silicon surface of said substrate from said silicon atoms and said titanium atoms, wherein the flow of said silicon source gas, the flow of said titanium tetrachloride, the temperature of said substrate, and the deposition pressure in said chamber are controlled to deposit an epitaxial titanium silicide film at a growth rate of less than 400 Å per minute.

12. A method of forming a titanium silicide film comprising:

heating a substrate having an epitaxial silicon surface in a deposition chamber to a temperature between 710–770° C.;

providing titanium tetrachloride into said deposition chamber;

providing a silicon source gas into said deposition chamber;

maintaining a deposition pressure between 5–10 torr in said deposition chamber;

thermally decomposing said titanium tetrachloride ($TiCl_4$) to provide titanium atoms and thermally decomposing said silicon source gas to form silicon atoms;

forming an epitaxial titanium silicide film directly on said epitaxial silicon surface of said substrate from said silicon atoms and said titanium atoms; and forming a second titanium silicide film directly on said epitaxial titanium silicide film wherein the process conditions used to form said second titanium silicide film are different than the conditions used to form said epitaxial titanium silicide film.

13. A method of forming a titanium silicide film comprising:

placing a substrate having an epitaxial silicon surface in a deposition chamber;

heating said substrate in said deposition chamber to a temperature of between 710–770° C.;

providing titanium tetrachloride into said deposition chamber at a flow rate between 2–10 sccms;

providing a silicon source gas selected from the group consisting of silane, dichlorosilane, and disilane, into said deposition chamber at a flow rate of between 5–25 sccms;

maintaining a deposition pressure between 5–10 torrs in said deposition chamber;

utilizing heat from said substrate to thermally decompose titanium tetrachloride ($TiCl_4$) to provide titanium atoms and utilizing heat from said substrate to thermally decompose said silicon source gas to form silicon atoms;

forming an epitaxial titanium silicide film from said silicon atoms and said titanium atoms directly on said epitaxial silicon surfaces of said substrate.

* * * * *